(12) United States Patent
Chiarelli

(10) Patent No.: US 10,916,871 B2
(45) Date of Patent: Feb. 9, 2021

(54) CONNECTION DEVICE

(71) Applicants: TE Connectivity Italia Distribution S.r.l., Collegno (IT); TE Connectivity Italia S.r.l., Collegno (IT)

(72) Inventor: Davide Chiarelli, Rivoli (IT)

(73) Assignees: TE Connectivity Italia Distribution S.r.l., Collegno (IT); TE Connectivity Italia S.r.l., Collegno (IT)

( * ) Notice: Subject to any disclaimer, the term of this patent is extended or adjusted under 35 U.S.C. 154(b) by 0 days.

(21) Appl. No.: 16/597,413

(22) Filed: Oct. 9, 2019

(65) Prior Publication Data

US 2020/0112114 A1 Apr. 9, 2020

(30) Foreign Application Priority Data

Oct. 9, 2018 (IT) .................. 102018000009268

(51) Int. Cl.
| | |
|---|---|
| *H01R 12/71* | (2011.01) |
| *H01R 12/70* | (2011.01) |
| *H01R 12/72* | (2011.01) |
| *H01R 12/73* | (2011.01) |
| *H01R 13/502* | (2006.01) |
| *H01R 13/514* | (2006.01) |
| *H01R 13/631* | (2006.01) |

(52) U.S. Cl.
CPC ....... *H01R 12/716* (2013.01); *H01R 12/7005* (2013.01); *H01R 12/727* (2013.01); *H01R 12/73* (2013.01); *H01R 13/502* (2013.01); *H01R 13/514* (2013.01); *H01R 13/631* (2013.01)

(58) Field of Classification Search
CPC .............. H01R 12/716; H01R 12/7005; H01R 12/727; H01R 12/73; H01R 13/502; H01R 13/514; H01R 13/631
USPC ......................................... 439/626
See application file for complete search history.

(56) References Cited

U.S. PATENT DOCUMENTS

| | | | | |
|---|---|---|---|---|
| 6,031,730 | A * | 2/2000 | Kroske ................. | H05K 1/148 361/784 |
| 6,354,887 | B2 * | 3/2002 | Maeda ................. | H01R 13/514 439/701 |
| 7,304,373 | B2 * | 12/2007 | Taggart ................. | H01L 23/50 174/254 |
| 8,272,897 | B1 * | 9/2012 | Lin ..................... | H01R 13/6594 439/607.4 |

(Continued)

FOREIGN PATENT DOCUMENTS

| | | |
|---|---|---|
| FR | 2458919 A1 | 1/1981 |
| JP | 2458919 A1 | 1/1981 |
| JP | H07161406 A | 6/1995 |

OTHER PUBLICATIONS

Italian Search Report and Written Opinion, dated May 21, 2019, 16 pages.

(Continued)

*Primary Examiner* — Harshad C Patel
(74) *Attorney, Agent, or Firm* — Barley Snyder

(57) ABSTRACT

A connection device connecting a plurality of PCB connectors with a printed circuit board includes a first positioning rib, a second positioning rib, and an elastic member between the first positioning rib and the second positioning rib. A distance between the first positioning rib and the second positioning rib is adjustable by deformation of the elastic member.

18 Claims, 11 Drawing Sheets

(56) References Cited

U.S. PATENT DOCUMENTS

| | | | | |
|---|---|---|---|---|
| 8,961,234 B2* | 2/2015 | Shani | .................... | H01R 12/73 |
| | | | | 439/629 |
| 9,166,327 B2* | 10/2015 | Yu | ......................... | H01R 13/46 |
| 9,475,694 B2* | 10/2016 | Martizon, Jr. | .......... | B81C 3/008 |
| 9,478,885 B2* | 10/2016 | MacDougall | .......... | H01R 12/83 |
| 10,681,812 B2* | 6/2020 | Hartman | .............. | H05K 3/4007 |
| 2012/0083141 A1* | 4/2012 | Molnar | ................ | H01R 12/728 |
| | | | | 439/82 |

OTHER PUBLICATIONS

Abstract of JPH07161406, dated Jun. 23, 1995, 1 page.
Abstract of FR2458919, dated Jan. 2, 1981, 1 page.
Extended European Search Report, App No. 19201882.8, dated Feb. 11, 2020, 7 pages.

* cited by examiner

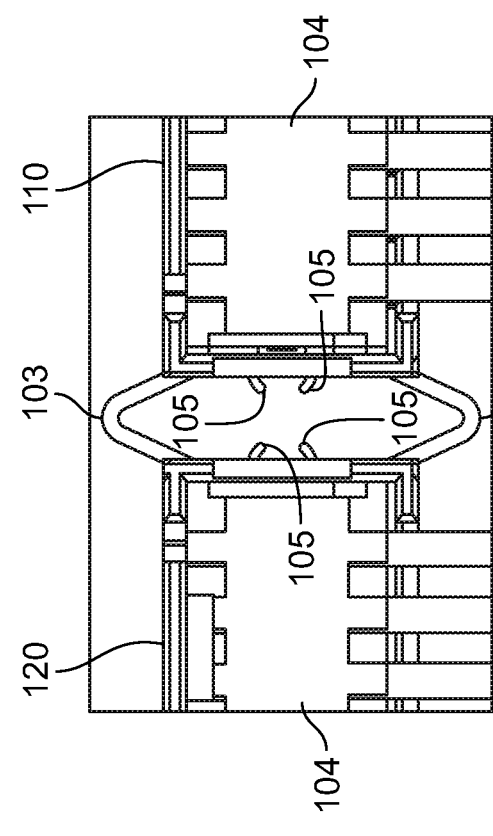
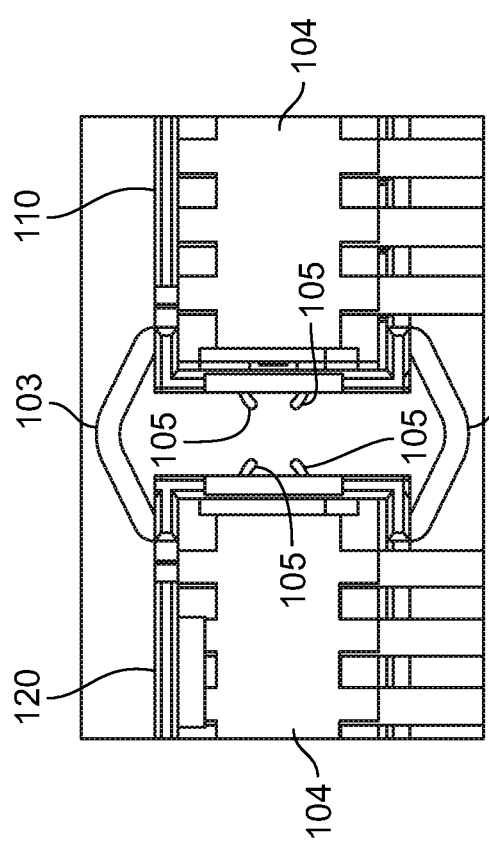
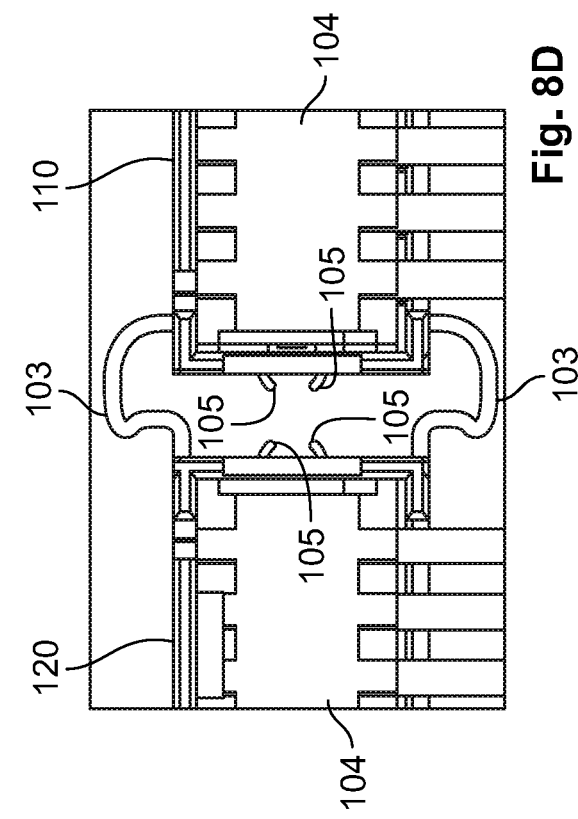
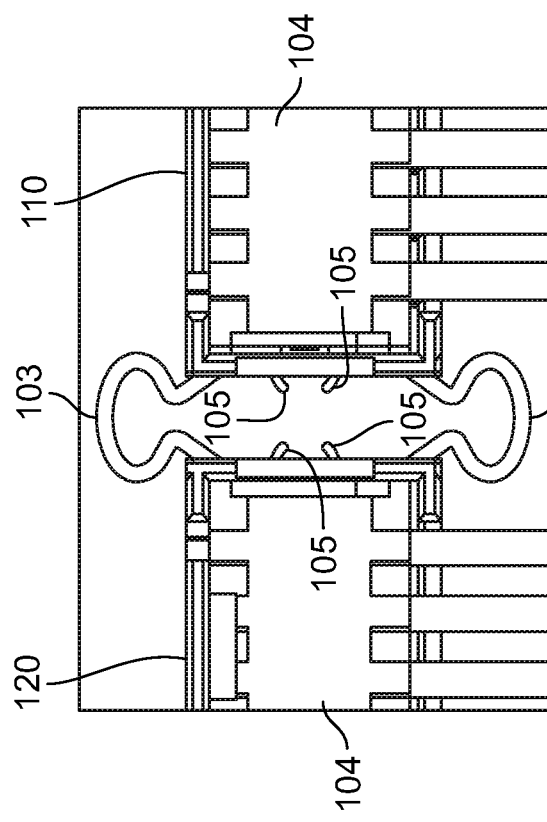

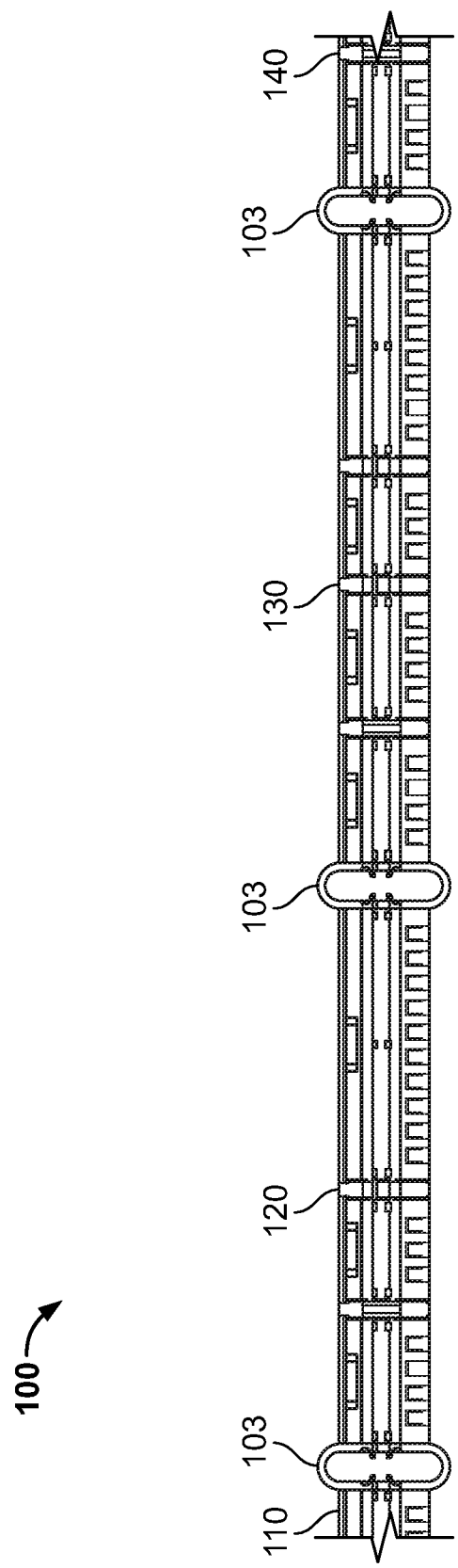

CONNECTION DEVICE

CROSS-REFERENCE TO RELATED APPLICATION

This application claims the benefit of the filing date under 35 U.S.C. § 119(a)-(d) of Italian Patent Application No. 102018000009268, filed on Oct. 9, 2018.

FIELD OF THE INVENTION

The present invention relates to a connection device and, more particularly, to a connection device for a printed circuit board.

BACKGROUND

Printed circuit boards (PCBs) are employed in a wide range of electronic products, for example in domestic appliances or the like. PCBs mechanically support and electrically connect several electrical components that guarantee the functionality of the electronic product into which the PCBs are built in.

PCBs are electrically connected to each other and/or to further components of the final electronic products. Moreover, electrical connections are needed for supplying power to the PCB. These electrical connections are realized by PCB connectors; for example, these electrical connections may be realized by edge connectors which are a type of PCB connectors. For example, these connections may be realized by RAST-connectors, such as RAST 2.5 or RAST5 connectors.

A single PCB may be connected to several PCB connectors. For example, each PCB connector may be dedicated to a particular component of the final electronic product and/or to a particular function to be carried out in the architecture of the system. For example, a single PCB connector may be dedicated to a power supply of the PCB. Because the architecture of several final electronic products has increased in complexity due to the number of operations that such products are able to carry out, the architecture of the PCBs has increased in complexity, and the number of PCB connectors to be connected to a single PCB has correspondingly also increased.

One of the problems related to the increasing number of PCB connectors to be connected to a single PCB is that the assembly operations are rendered more time consuming and thus more costly. This is in particular the case when such assembly operations are carried out by the manufacturer of the final electronic products or even at the OEM (Original Equipment Manufacturer) level. Connecting several PCB connectors to a single PCB at this level of the manufacturing process is thus undesirable.

In order to overcome this problem, connection devices for PCBs have been developed that allow connecting a plurality of PCB connectors to a single PCB in a single connection step. Basically, the plurality of PCB connectors is first connected to one connection device. This operation may be carried out at the harness maker level; the harness maker may provide the connection device connected to a plurality of PCB connectors. Afterwards, the OEM or the manufacturer of the final electronic products simply connects the connection device to a single PCB with a single connection operation thus achieving the connection of several PCB connectors with the PCB with just this single operation. The assembly operations at the OEM level are significantly simplified.

The connection device, however, may present tolerance issues. In particular, mating the connection device with the PCB may be rendered difficult or inaccurate because of dimensional differences between the connection device and the PCB due, for example, to unavoidable manufacturing errors or to different thermal behavior of the connection device with respect to the PCB. This could result in contacts which are misaligned on the PCB. Moreover, even if appropriate mating is achieved when assembling the system, possible dimensional variations in the lifetime of the product, for example due to temperature changes or the like, could result in fretting corrosion or contact misalignments. These issues become more critical if the length of the connection device is increased to allow several PCB connectors to be connected with a single PCB using the connection device.

SUMMARY

A connection device connecting a plurality of PCB connectors with a printed circuit board includes a first positioning rib, a second positioning rib, and an elastic member between the first positioning rib and the second positioning rib. A distance between the first positioning rib and the second positioning rib is adjustable by deformation of the elastic member.

BRIEF DESCRIPTION OF THE DRAWINGS

The invention will now be described by way of example with reference to the accompanying Figures, of which:

FIG. 8A is a side view of an elastic member of a connection device according to an embodiment;

FIG. 8B is a side view of an elastic member of a connection device according to another embodiment;

FIG. 8C is a side view of an elastic member of a connection device according to another embodiment;

FIG. 8D is a side view of an elastic member of a connection device according to another embodiment;

FIG. 9 is a side view of a connection device according to another embodiment;

DETAILED DESCRIPTION OF THE EMBODIMENT(S)

Figure 1:
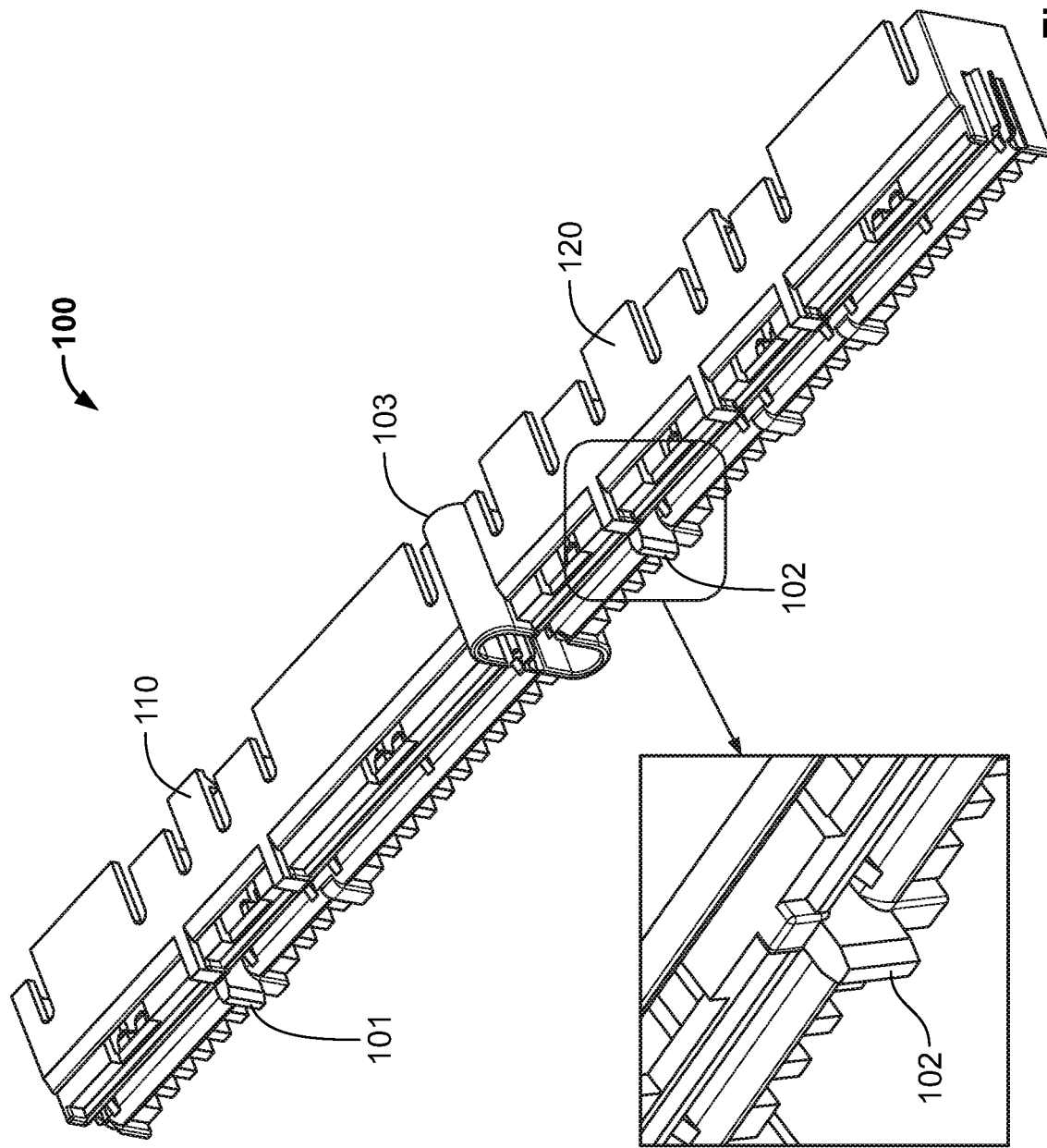
FIG. 1A is a rear perspective view of a connection device according to an embodiment.
FIG. 1B is an enlarged rear perspective view of a portion of the connection device boxed in FIG. 1A.

The present invention is described hereinafter with reference to particular embodiments as illustrated in the attached figures. In the attached figures, the same reference numerals and/or signs indicate the same part and/or similar and/or corresponding parts of the system. The present invention is not limited to the particular embodiments described in the following detailed description and represented in the figures, but rather the embodiments described simply exemplify the various aspects of the present invention, the scope of which is defined by the claims. Further modifications and variations of the present invention will become clear to those skilled in the art.

A connection device 100 according to an embodiment is shown in FIGS. 1A-3. The connection device 100 comprises a first connection device segment 110 and a second connection device segment 120. The first connection device segment 110 is attached to the second connection device segment 120 by an elastic member 103.

As shown in FIGS. 1A and 1B, the first connection device segment 110 has a first positioning rib 101 and the second connection device segment 120 has a second positioning rib 102. In shown embodiment, the positioning ribs 101 and 102 are pointed; this shape simplifies the insertion of the positioning ribs 101, 102 in the corresponding positioning recesses of the PCB, as described below. Nevertheless, in other embodiments, other shapes of the positioning ribs 101, 102 are possible. The first and second positioning ribs 101 and 102 protrude towards the rear of the connection device 100. The first positioning rib 101 and/or the second positioning rib 102, in an embodiment, is integral with the corresponding connection device segment 110, 120. Alternatively, the first positioning rib 101 and/or the second positioning rib 102 may be fixed to the corresponding connection device segment 110, 120 in any possible manner.

The elastic member 103, as shown in FIG. 1A, is positioned between the first positioning rib 101 and the second positioning rib 102. Accordingly, a mutual distance between the two positioning ribs 101, 102 may be adjusted by a deformation of the elastic member 103. In particular, a contraction of the elastic member 103 would result in a decrease of the distance between the two positioning ribs 101, 102. An extension of the elastic member 103 would result in an increase of this distance. In the embodiment shown in FIG. 1A, the first connection device segment 110 may be pushed toward the second connection device segment 120 by compressing the elastic member 103 so as to reduce the distance between the ribs 101 and 102. Alternatively, the first connection device segment 110 may be pulled away from second connection device segment 120 by extending elastic member 103 so as to increase the distance between the ribs 101 and 102.

In an embodiment, the elastic member 103 may be made of a same material as other components of the connection device 100. The elastic member 103 may be made for example of plastic materials, for example thermoplastic resins such as polyamide or polypropylene.

Figure 2:
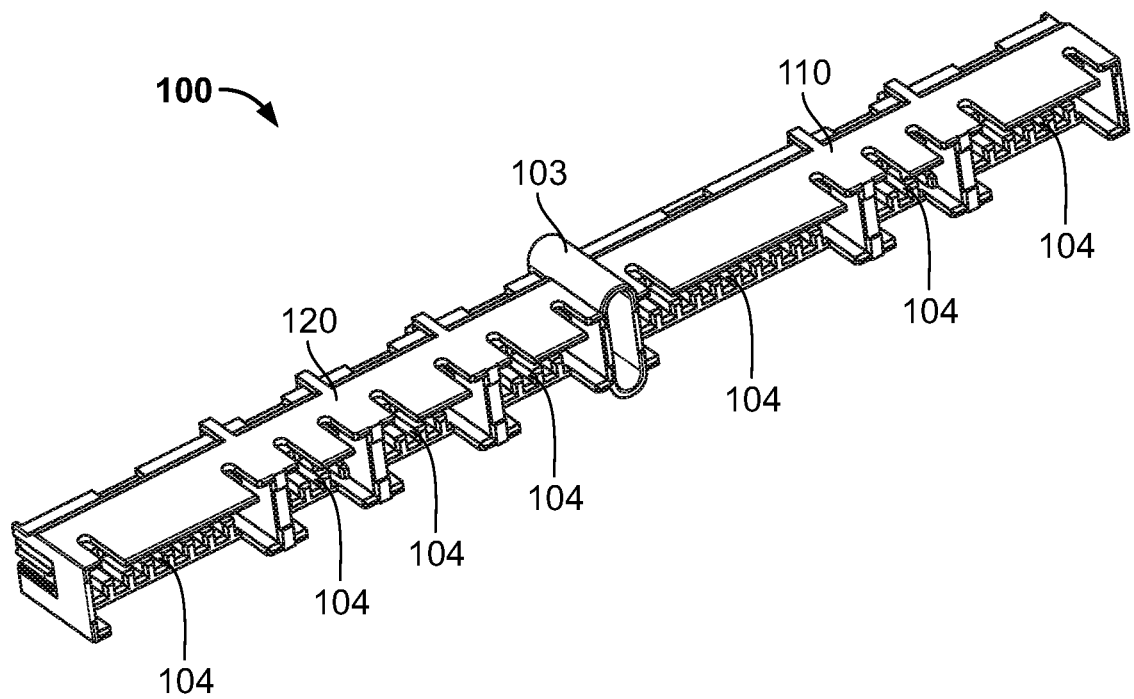
FIG. 2 is a front perspective view of the connection device of FIG. 1A.

As shown in FIG. 2, each connection device segment 110, 120 has a plurality of housings 104. In the shown embodiment, the first connection device segment 110 has three housings 104 and the second connection device segment 120 has four housings 104. In other embodiments, the first connection device segment 110 and the second connection device segment 120 can have the same number of housings 104; the first connection device segment 110 and the second connection device segment 120 may be structurally identical to each other. Each of the housings 104 is adapted to house a PCB connector, as described in greater detail below. In particular, each of the housings 104 is configured so that a PCB connector that is housed in the housing 104 is both in mechanical and electrical connection with the connection device 100. In other words, a PCB connector housed in one of the housings 104 is not only mechanically fixed to and supported by the connection device 100, but it is also in electrical connection with the connection device 100, so that when the connection device 100 is in turn connected to a PCB there is automatically an electrical connection between the PCB connector and the PCB.

Figure 3:
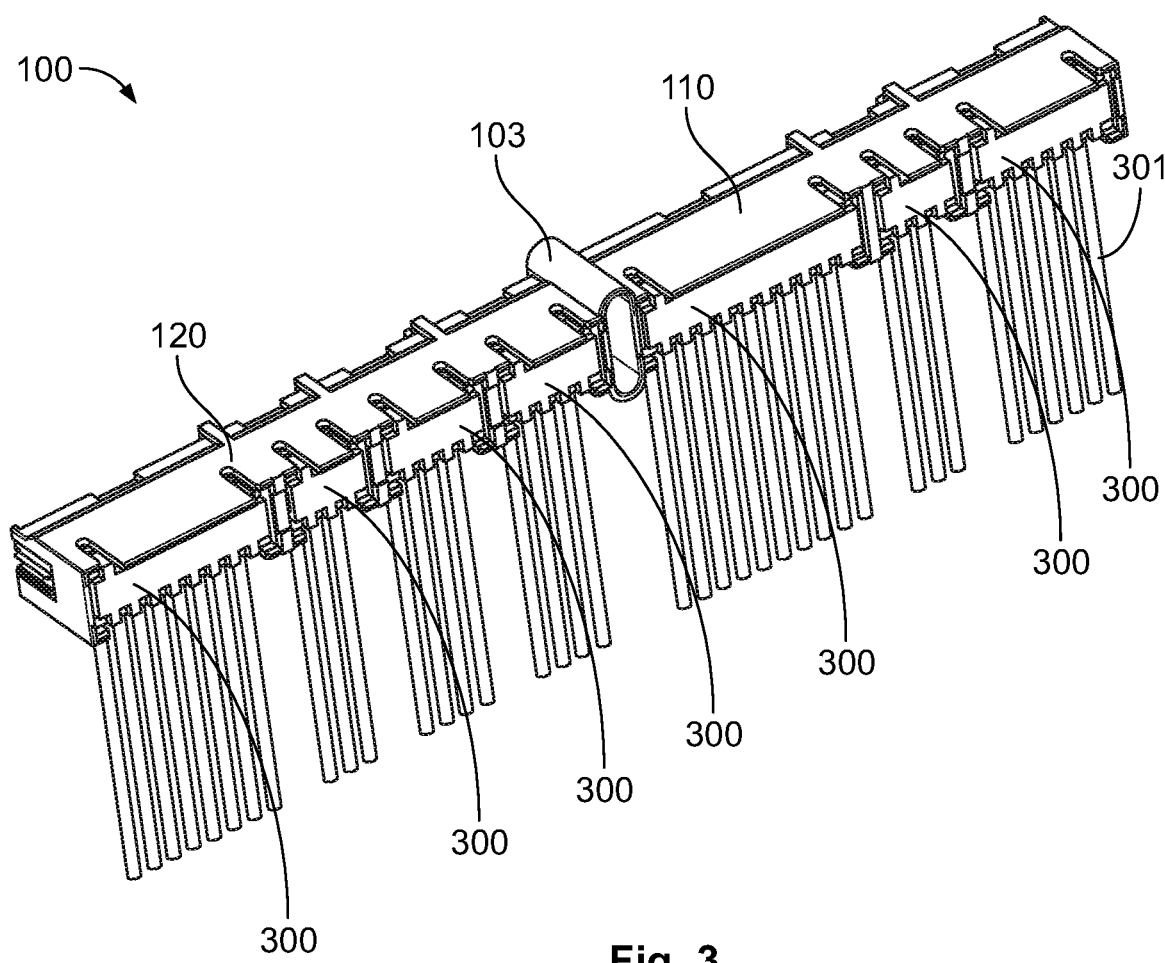
FIG. 3 is a perspective view of the connection device of FIG. 1A with a plurality of PCB connectors.

The connection device 100 is shown connected to a plurality of PCB connectors 300 in FIG. 3. Each of the housings 104 shown in FIG. 2 houses a PCB connector 300. Each of the PCB connectors 300 has a certain number of connection wires 301 for carrying the signals input to and/or output from the PCB connector 300. In the shown embodiment each of the housings 104 carries a connector 300 however, in other embodiments, one or more of the housings 104 may lack a corresponding PCB connector 300, or one housing 104 may house a plurality of PCB connectors 300. Moreover, even if the shown embodiment schematically shows that all the connectors 300 housed in the housings 104 are of the same type, for example RAST2.5 connectors, in other embodiments the housings 104 may be configured for housing also different types of connectors, for example RAST5 connectors, and also for housing combinations of different types of connectors, for example RAST2.5 and RAST5 connectors.

Figure 4A:
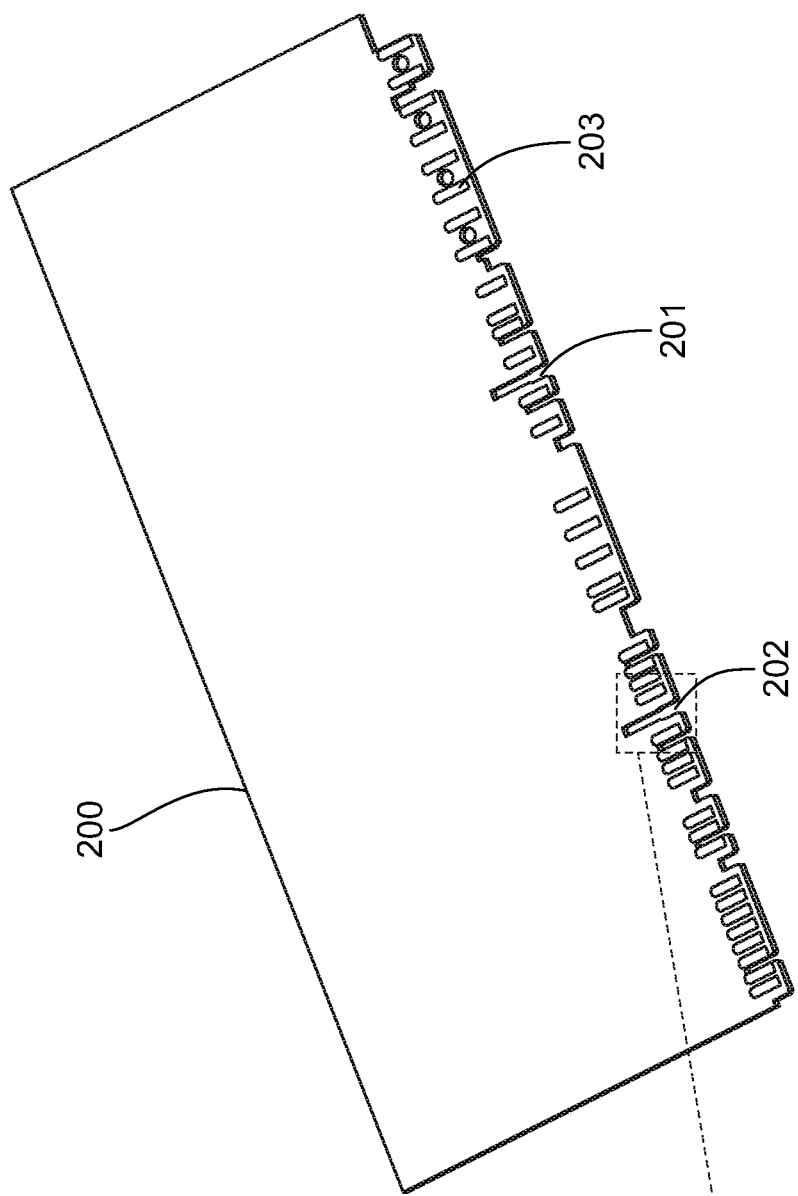
FIG. 4A is a perspective view of a PCB according to an embodiment.

A PCB 200 according to an embodiment, as shown in FIG. 4A, includes a first positioning recess 201 and a second positioning recess 202 for housing first positioning rib 101 and second positioning rib 102, respectively, of the connection device 100. The second positioning recess 202 is shown in more detail in the enlargement of FIG. 4B. The first positioning recess 201 and second positioning recess 202 may be dimensioned and/or shaped so as to match the dimension and/or shape of the positioning ribs 101 and 102. In the shown embodiment, the ribs 101 and 102 are identical and the recesses 201 and 202 are identical as well, but in other embodiments, each of the ribs 101 and 102 could have a specific shape and/or a specific dimension which is then matched by the corresponding positioning recess 201, 202 of the PCB 200. In an embodiment, a width of the recesses 201 and 202 could be in the range of 1.5 mm. The depth of the recesses 201 and 202 depends on the degree of overlap between the PCB and the connection device and may be, for example, in the range of 10 mm.

Figure 4B:
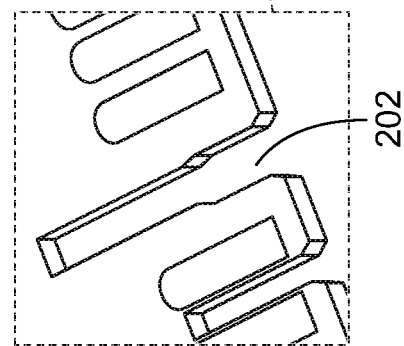
FIG. 4B is an enlarged perspective view of a portion of the PCB boxed in FIG. 4A.

In the embodiment shown in FIGS. 4A and 4B, the first positioning recess 201 and the second positioning recess 202 have a first portion in correspondence to the edge of the PCB and a second terminal portion, wherein a lateral width of the first portion is larger than a lateral width of the second terminal portion. A transition region is disposed between the two portions wherein the lateral width decreases in a continuous manner. This configuration simplifies the insertion of the positioning ribs 101 and 102. Nevertheless, other configurations of the positioning recesses 201 and 202, for example configurations wherein the lateral width of the recess 201, 202 is constant along the length of the recess 201, 202 or continuously decreases from the edge of the PCB 200 to the end of the recess 201, 202, are also possible. The positioning recesses 201, 202 may also comprise a wide opening directly at the edge of the PCB 200, for example as shown in FIG. 4B, to facilitate insertion of the positioning ribs 101, 102. Providing the recesses 201, 202 and/or the positioning ribs 101, 102 with chamfered edges simplifies and improves the insertion process.

A plurality of contact pads 203 of the PCB 200 for the electrical contact between the connection device 100 and the PCB 200 are shown in FIG. 4A. The electronic architecture of the PCB 200, however, is not described in further detail because it is not limiting for the present invention and it is apparent for the skilled person that every possible electronic architecture of a PCB can be implemented in the ambit of the present invention.

Figure 5A:
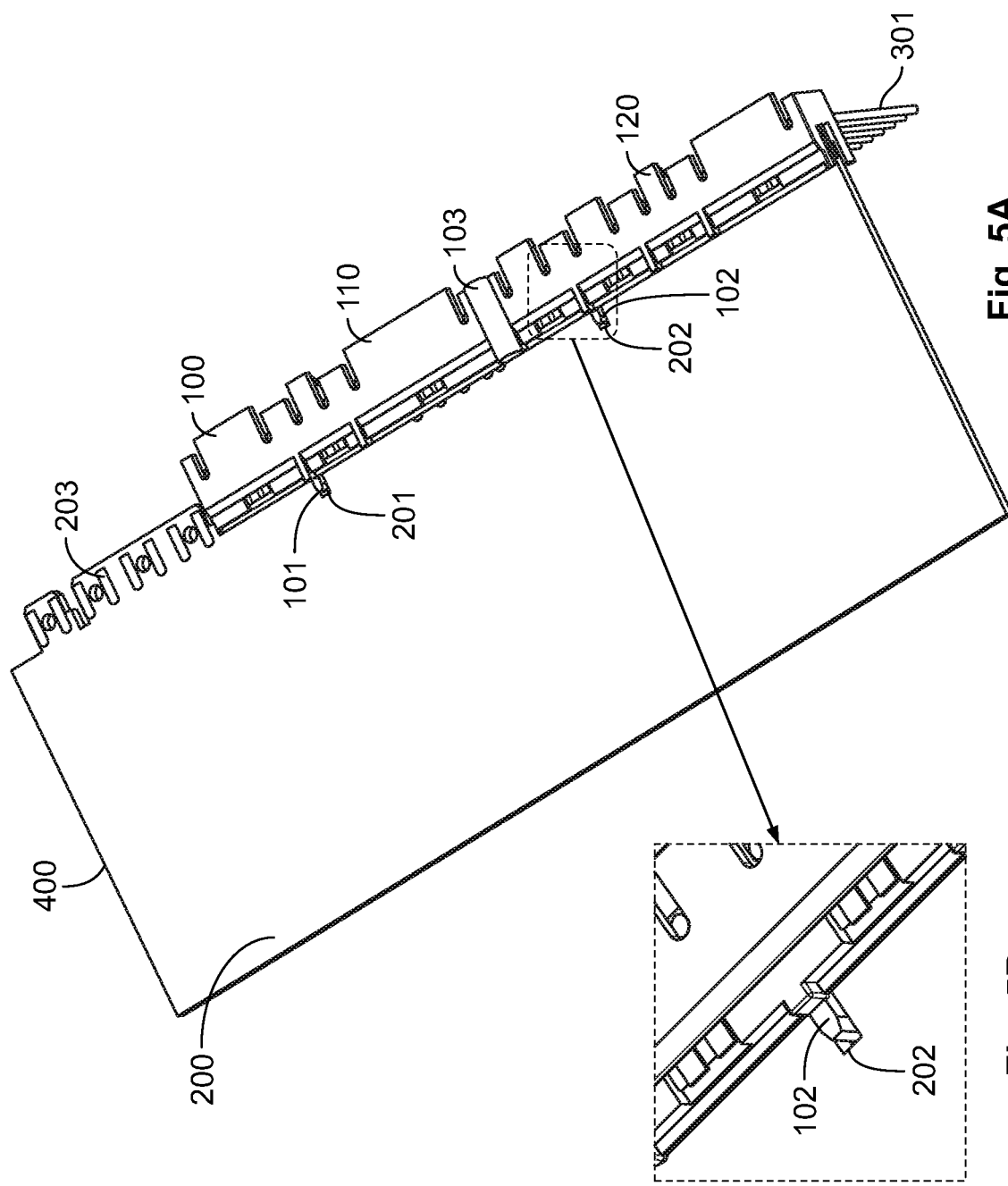
FIG. 5A is a perspective view of an electronic module according to an embodiment.
Figure 5B:
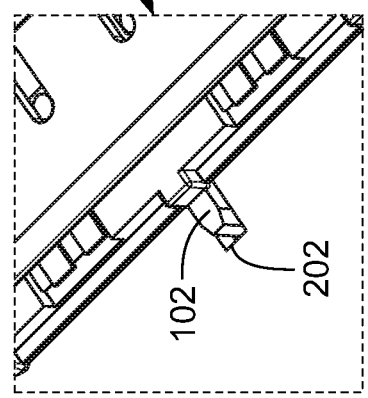
FIG. 5B is an enlarged perspective view of a portion of the electronic module boxed in FIG. 5A.

An electronic module 400 according to an embodiment, as shown in FIG. 5A, includes the connection device 100 of FIG. 1A connected to the PCB 200 of FIG. 4A. The positioning ribs 101 and 102 of the connection device 100 are housed in the corresponding positioning recesses 201 and 202, respectively, of the PCB 200. The connection device 100 is both mechanically and electrically coupled to the PCB 200. If, for any reason, when assembling the connection device 100 to the PCB 200 the distance between the positioning ribs 101 and 102 does not exactly matches the distance between the positioning recesses 201 and 202, exploiting the elastic deformation of the elastic element 103 it is possible to adjust the distance between the positioning ribs 101 and 102, so that the distances match and the ribs 101 and 102 can be properly inserted in the corresponding recesses 201 and 202.

In an embodiment, the first connection device segment 110 and the second connection device segment 120 are exclusively connected by the elastic member 103. In other embodiments, the elastic deformation of the elastic member 103 is constrained by stopping elements that allow only a certain deformation of the elastic member 103, for example, a deformation by a given and predefined length.

The first and second positioning ribs 101, 102 allow aligning and joining together the connection device 100 with the PCB 200. When the first positioning rib 101 is housed in the first positioning recess 201 of the PCB 200 and the second positioning rib 102 is housed in the second positioning recess 202, the connection device 100 and the PCB 200 are correctly aligned so that the PCB connectors 300 carried by the connection device 100 are properly connected, both mechanically and electrically, with the PCB 200. Moreover, the presence of the positioning ribs 101 and 102 of the connection device 100 inserted into the corresponding recesses 201 and 202 of the PCB act as a constraint against possible displacements and/or misalignments of the connection device 100 with respect to the PCB 200 during the lifetime of the system. At the same time, because the system is provided with the elastic member 103, the elastic behavior of the elastic member 103 compensates for such possible displacements, due for example to temperature variations or the like, thus reducing the risk of fretting corrosion or misalignments during the lifetime of the system. The "elastic behavior" or "elastic deformation" can refer to an extension, a compression, or both of the elastic member 103.

Figure 6:
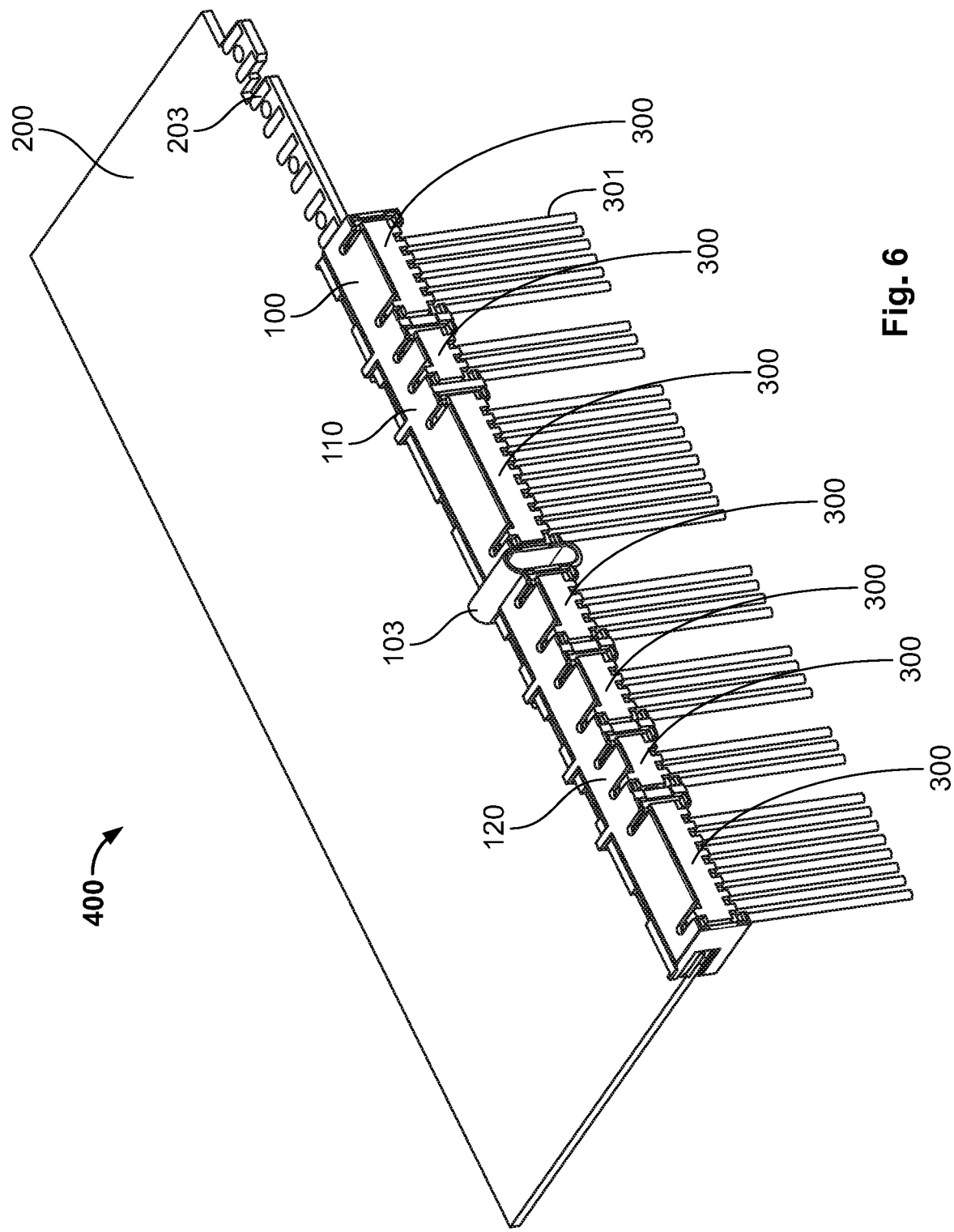
FIG. 6 is a perspective view of the electronic module of FIG. 5A.

FIG. 6 shows the PCB connectors 300 housed in the connection device 100 within the electronic module 400. Each of the PCB connectors 300 is both mechanically and electrically coupled to the PCB 200 via the connection device 100. Accordingly, signals to be input to the PCB 200 may be input via the connection wires 301 of the PCB connectors. Similarly, signals which are output from the PCB 200 may be collected via the connection wires 301 of the PCB connectors 300. The single operation of assembling the connection device 100 with the PCB 200 allows electrical contacts between all the PCB connectors 300 carried by the connection device 100 and the PCB 200 in a single step. For example, a harness maker could provide a system in the configuration of FIG. 3 and the manufacturer of the final electronic product could achieve the connection of all the PCB connectors 300 with the PCB 200 schematically shown in FIG. 6 simply by a single assembly step.

Figure 7:
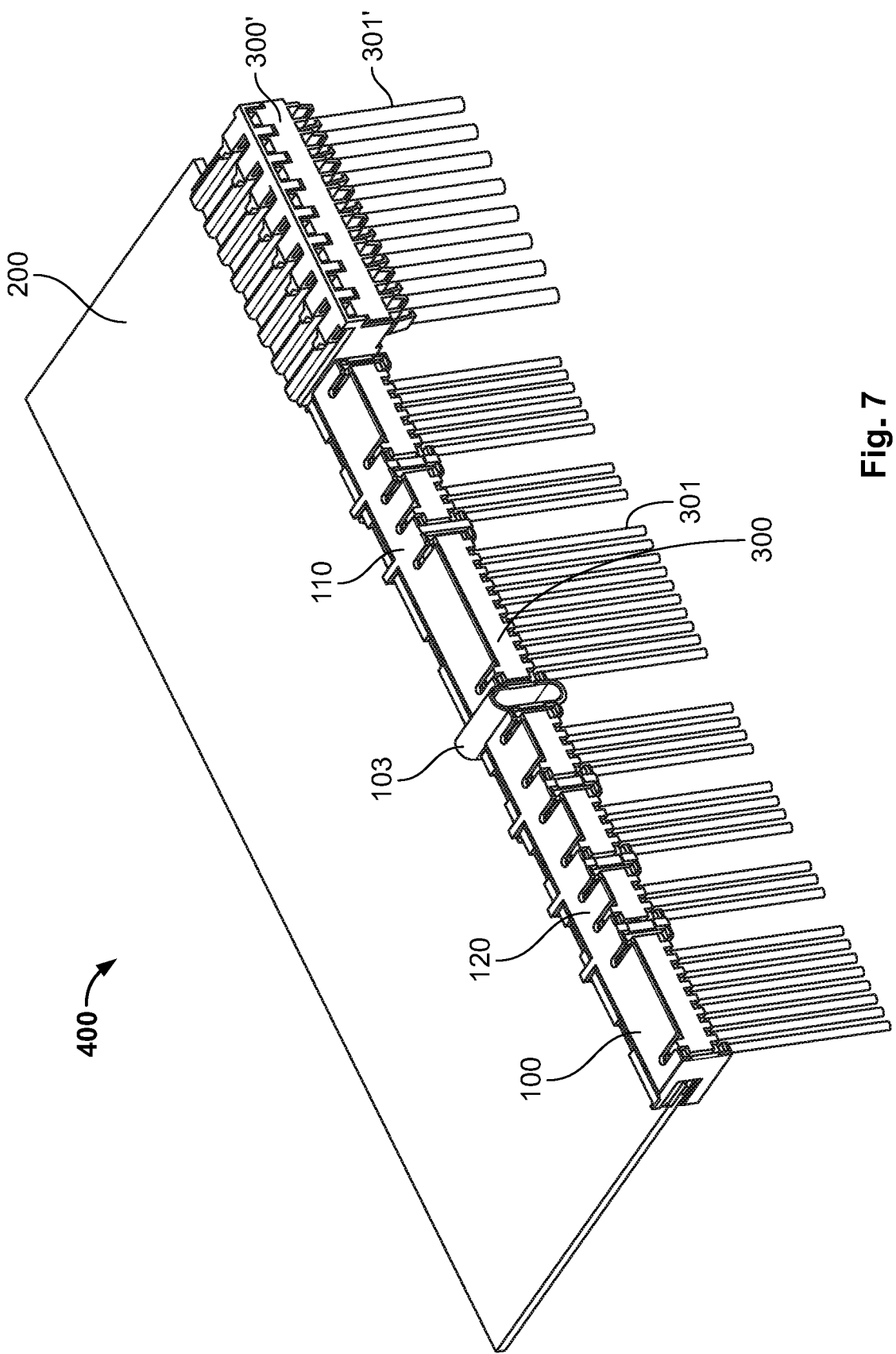
FIG. 7 is a perspective view of an electronic module according to another embodiment.

An electronic module 400 according to another embodiment, as shown in FIG. 7, includes a further PCB connector 300', with corresponding connection wires 301', connected to the PCB 200. The connector 300' could be, for example, dedicated to power supply for the PCB 200. The connector 300' is connected to PCB 200 with a further connection step so that the configuration of FIG. 7 is obtained by two connection steps: a step of connecting the connection device 100 to the PCB 200, and a step of connecting the connector 300' to the PCB 200. Consequently, even if a certain number of PCB connectors 300 may be easily and precisely connected to the PCB 200 with a single assembly step with the connection device 100, any other number of PCB connectors 300' could be connected to the PCB 200 by corresponding dedicated assembly steps. Moreover, even more than one connection devices according to the present invention could be connected to a single PCB.

FIGS. 8A to 8D schematically show different possible configurations of the elastic member 103 in cross sections according to particular embodiments. As will be appreciated by those skilled in the art, different configurations of the elastic member 103 correspond to different elastic properties and behaviors which would thus reflect in the adjustment of the distance between the positioning ribs 101 and 102. FIGS. 8A-8D further show that, in various embodiments, the elastic member 103 may be placed so that a first elastic portion adjoins the upper portions of the connection device segments 110 and 120 and a second elastic portion adjoins the lower portions of the connection device segments 110 and 120.

The system, as shown in FIGS. 8A-8D, may have a fastening device 105 for securing the connection device 100 to the PCB 200 in a releasable manner. In an embodiment, the fastening device 105 may be elastic pins which, pairwise, hold the PCB 200. In particular, the pair of elastic pins act on the thickness of the PCB 200 so as to hold the PCB 200. The PCB 200 is inserted between the pins. In this way, a simple and reliable releasable coupling is achieved. In the embodiment shown in FIGS. 8A-8D, the fastening device 105 is located in the region of the elastic member 103. In other embodiments, the fastening device 105 may be located in other regions of the connection device 100. The presence and/or the structure of the fastening device 105 is independent of the particular configuration of the elastic member 103; even if the fastening device 105 is shown in combination with the specific configurations of the elastic member 103 in FIGS. 8A-8D, the fastening device 105 could be provided with any possible configuration of the elastic member 103.

A connection device 100 according to another embodiment, as shown in FIG. 9, comprises a plurality of positioning ribs 101, 102 and a plurality of elastic member 103. Each of the elastic members 103 is placed between a pair of positioning ribs 101, 102 so that the distance between the positioning ribs 101, 102 is adjustable by the deformation of the elastic member 103. The embodiment of FIG. 9 has a plurality of connection device segments wherein each connection device segment has a positioning rib 101, 102 and the connection device segments are attached to each other by the elastic member 103.

In various embodiments, the connection device 100 may comprise three, four, five, six or any other desired number of positioning ribs 101, 102. In an embodiment, the number of positioning ribs 101, 102 is equal to the number of positioning recesses 201, 202. In another embodiment, the number of positioning ribs 101, 102 is less than the number of positioning recesses 201, 202. Each elastic member 103 is disposed between a pair of positioning ribs 101, 102. In general, if the connection device 100 comprises N positioning ribs 101, 102, with N being any natural number equal to or greater than 2, the connection device 100 may comprise N−1 elastic members 103, wherein each elastic member 103 is placed between two adjacent positioning ribs 101, 102.

The connection device 100 of FIG. 9 has a first connection device segment 110, a second connection device segment 120, a third connection device segment 130, and a fourth connection device segment 140. Each of the segments 110, 120, 130, 140 has at least one positioning rib 101, 102. The first connection device segment 110 is attached to the second connection device segment 120 by the elastic member 103. The second connection device segment 120 is attached to the third connection device segment 130 the elastic member 103. The third connection device segment 130 is attached to the fourth connection device segment 140 by the elastic member 103. Such a configuration with a plurality of connection device segments 110, 120, 130, 140 and a plurality of elastic members 130 therebetween is particularly advantageous for particularly long connection devices. Tolerance issues between the mutual distances of the positioning ribs 101, 102 and the distances of corresponding positioning recesses 201, 202 of the PCB 200 could be easily and accurately dealt with by exploiting the elastic deformations of the various elastic members 103 of the system.

Figure 10:
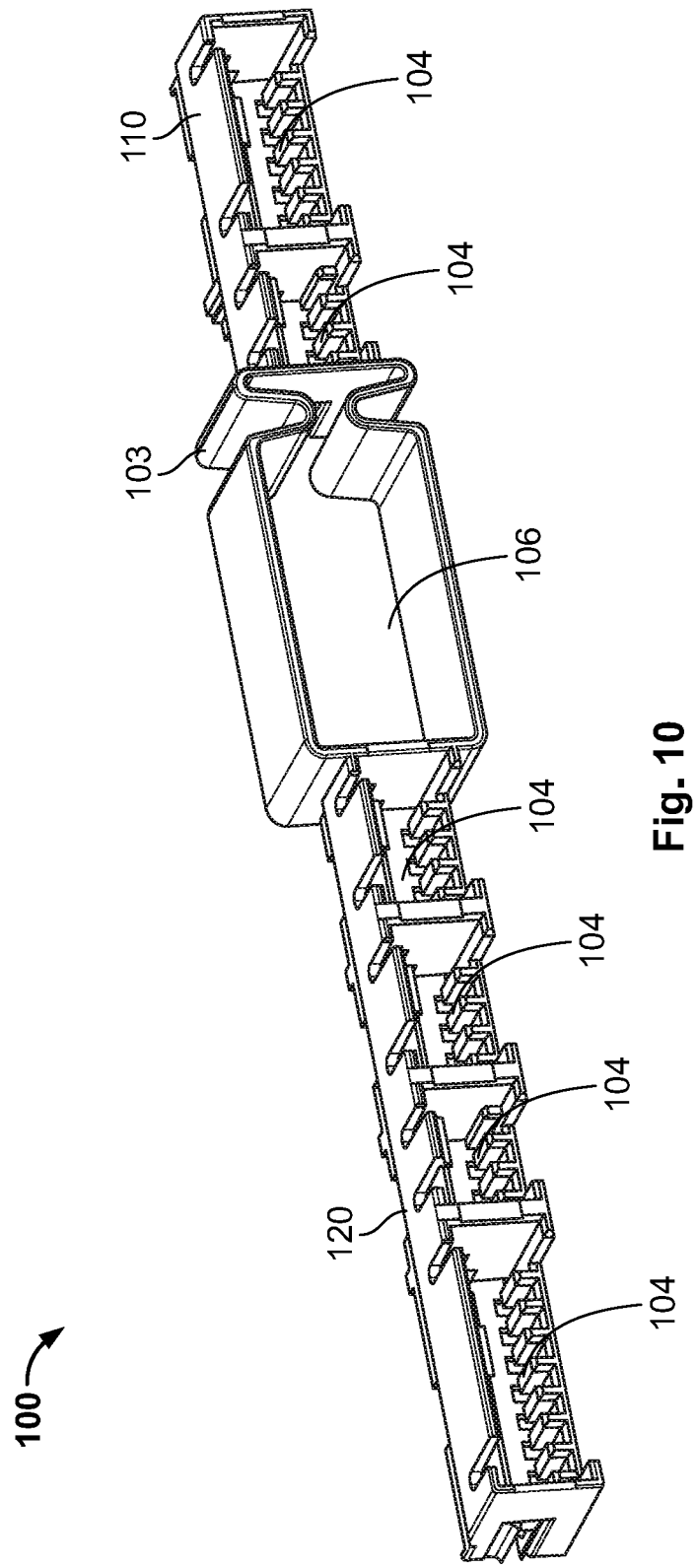
FIG. 10 is a perspective view of a connection device according to another embodiment.

A connection device 100 according to another embodiment, as shown in FIG. 10, includes a first connection device segment 110 attached to a second device segment 120 by the elastic member 103. The second device segment 120 not only includes four housings 104 adapted to provide both mechanical and electrical connection between the connection device 100 and the PCB connectors housed in the housings 104, but also a receptacle 106. Receptacle 106 houses a PCB connector 300″, shown in FIG. 11, which is connected to the system after the connection device 100 has been connected. In other words, differently from the housings 104, receptacle 106 is not configured to provide mechanical and electrical connection between the PCB connector 300″ housed therein and the PCB 200, but only to provide space for such a connector 300″ which is to be attached to the system after the connection device 100 has been connected to the PCB 200. The system could be provided with any number of housings 104 and any number of receptacles 106 according to the design which is desired. The receptacles 106 could be configured for housing any type of PCB connector. For example, the receptacles 106 could be configured for housing RAST-connectors, for example RAST5 and/or RAST2.5 connectors.

Figure 11:
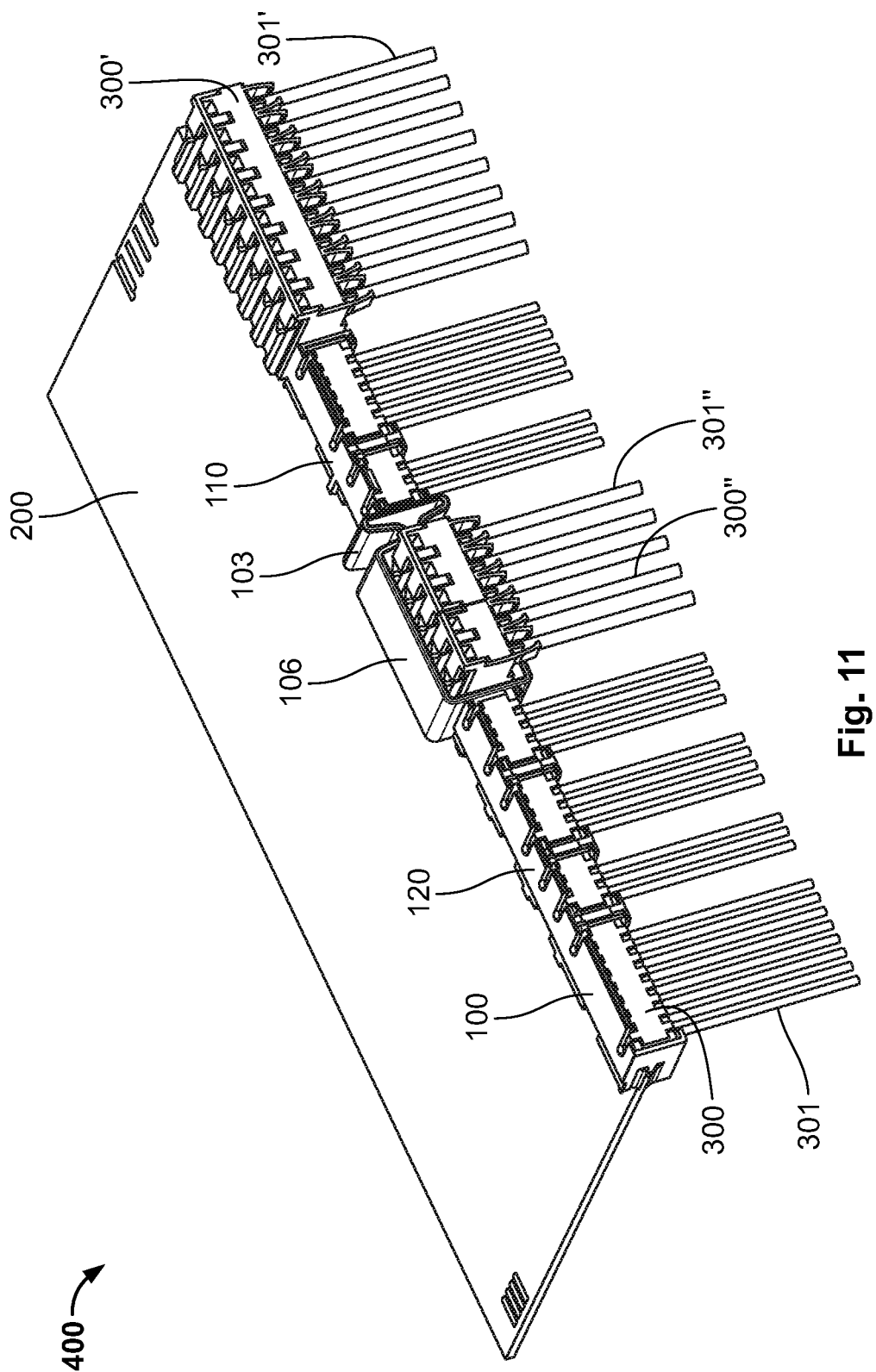
FIG. 11 is a perspective view of an electronic module according to another embodiment.

A configuration of an electronic module 400 with the connection device 100 of FIG. 10 is shown in FIG. 11. The system not only comprises PCB connectors 300 connected to the PCB 200 via the connection device 100, but also PCB connector 300′ which is directly attached and electrically connected to the PCB 200 independently of the connection device 100 and PCB connector 300″ which is mechanically coupled to the PCB 200 via receptacle 106 of the connection device 100 but which is directly electrically connected to the PCB 200. The assembly process of the module 400 may thus comprise three steps: a step of connecting the connection device 100 previously provided with the PCB connectors 300 to the PCB 200, a step of connecting the PCB connector 300′ to the PCB 200 and a step of inserting the PCB connector 300″ into the receptacle 106 and connecting it to the PCB 200.

Several configurations of the connection device 100 with any number of connection device segments 110, 120, 130, 140 are possible. The segments of a single connection device 100 may all have the same structure. Alternatively, the segments 110, 120, 130, 140 may differ from each other or there can be a certain number of equal segments attached to a certain number of different segments. Moreover, each connection device segment 110, 120, 130, 140 may in turn comprise any number of housings 104 and/or any number of receptacles 106, or any combination thereof. For example, different types of housings 104, such as housings 104 for different types of PCB connectors, for example RAST2.5 and RAST5 connectors, may be combined. Moreover, also different types of housings 104 may be combined with different types of receptacles 106. Furthermore, the electronic modules may comprise one or more connection devices 100 according to the invention and any desired number of PCB connectors 300 directly connected to a PCB 200.

A domestic appliance according to an embodiment of the invention comprises the connection device 100 or the electronic module 400. The manufacturing process of such a domestic appliance is simplified due to the presence of the connection device 100 and/or of the electronic module 400, so that the corresponding costs are reduced. The connection device 100 or the electronic module 400 is used with domestic appliances comprising PCBs with many connections, in particular when such connections are concentrated on one of the edges of the PCBs. In various embodiments, the domestic appliance may be a washing machine, a dishwasher, a refrigerator, a dryer, an oven or a cooking plate.

No details have been provided on the possible electronic architecture of the PCB or of the PCB connectors since, as it will be apparent to those skilled in the art, several types of PCBs known to the skilled person and/or several types of PCB connectors, also known by the skilled person, may be adopted in the ambit of the present invention. The same holds true for the countless types of electrical components that may be carried by the PCBs.

What is claimed is:

1. A connection device connecting a plurality of PCB connectors with a printed circuit board, comprising:
   a first connection device segment;
   a first positioning rib disposed on the first connection device segment and protruding beyond a side of the first connection device segment;
   a second connection device segment;
   a second positioning rib disposed on the second connection device segment and protruding beyond a side of the second connection device segment; and
   an elastic member between the first positioning rib and the second positioning rib, a distance between the first positioning rib and the second positioning rib is adjustable by deformation of the elastic member.

2. The connection device of claim 1, wherein the first positioning rib is housed in a first positioning recess of the printed circuit board and the second positioning rib is housed in a second positioning recess of the printed circuit board.

3. The connection device of claim 1, wherein the first connection device segment is attached to the second connection device segment by the elastic member.

4. The connection device of claim 3, wherein the elastic member includes a first elastic portion adjoining an upper portion of each of the first connection device segment and the second connection device segment and a second elastic portion adjoining a lower portion of each of the first elastic device segment and the second elastic device segment.

5. The connection device of claim 1, further comprising a plurality of housings that house the PCB connectors.

6. The connection device of claim 1, further comprising a fastening device releasably securing the connection device to the printed circuit board.

7. The connection device of claim 6, wherein the fastening device is disposed in a region of the elastic member.

8. The connection device of claim 7, wherein the fastening device includes a first pair of pins extending from the first connection device segment and a second pair of pins extending from the second connection device segment.

9. The connection device of claim 1, further comprising a plurality of positioning ribs and a plurality of elastic members, each of the elastic members is positioned between a pair of positioning ribs.

10. The connection device of claim 9, further comprising a plurality of connection device segments, each of the connection device segments has one of the positioning ribs.

11. The connection device of claim 10, wherein the connection device segments are attached to one another by the elastic members.

12. The connection device of claim 1, wherein the PCB connectors are carried by the connection device and are in mechanical and electrical contact with the connection device.

13. The connection device of claim 1, further comprising a receptacle receiving at least one of the PCB connectors that is directly connected to the printed circuit board.

14. An electronic module, comprising:
a connection device including a first connection device segment, a first positioning rib disposed on the first connection device segment and protruding beyond a side of the first connection device segment, a second connection device segment, a second positioning rib disposed on the second connection device segment and protruding beyond a side of the second connection device segment, and an elastic member between the first positioning rib and the second positioning rib, a distance between the first positioning rib and the second positioning rib is adjustable by deformation of the elastic member; and
a printed circuit board having a first positioning recess receiving the first positioning rib and a second positioning recess receiving the second positioning rib.

15. A domestic appliance, comprising:
a connection device including a first connection device segment, a first positioning rib disposed on the first connection device segment and protruding beyond a side of the first connection device segment, a second connection device segment, a second positioning rib disposed on the second connection device segment and protruding beyond a side of the second connection device segment, and an elastic member between the first positioning rib and the second positioning rib, a distance between the first positioning rib and the second positioning rib is adjustable by deformation of the elastic member.

16. The domestic appliance of claim 15, wherein the domestic appliance is a washing machine, a dishwasher, a refrigerator, a dryer, an over, or a cooking plate.

17. A method of assembling a connection device with a printed circuit board, comprising:
providing a connection device including a first connection device segment, a first positioning rib disposed on the first connection device segment and protruding beyond a side of the first connection device segment, a second connection device segment, and a second positioning rib disposed on the second connection device segment and protruding beyond a side of the second connection device segment;
providing the printed circuit board having a first positioning recess and a second positioning recess;
inserting the first positioning rib in the first positioning recess and the second positioning rib in the second positioning recess; and
adjusting a distance between the first positioning rib and the second positioning rib to match a distance between the first positioning recess and the second positioning recess.

18. The method of claim 17, wherein the adjusting step is performed by deforming an elastic member between the first positioning rib and the second positioning rib.

* * * * *